United States Patent
Whitted

(10) Patent No.: US 6,906,920 B1
(45) Date of Patent: Jun. 14, 2005

(54) DRIVE COOLING BAFFLE

(75) Inventor: William H. Whitted, Palo Alto, CA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 10/675,239

(22) Filed: Sep. 29, 2003

(51) Int. Cl.$^7$ .................................................. H05K 7/20
(52) U.S. Cl. ...................... 361/695; 361/690; 361/694; 174/16.1; 165/104.33; 165/104.34; 165/122; 454/184
(58) Field of Search ................................. 361/690, 693, 361/695, 719–721; 165/80.2, 80.3, 104.33, 122; 174/16.1, 16.3; 454/184

(56) References Cited

U.S. PATENT DOCUMENTS

| | | | | |
|---|---|---|---|---|
| 6,364,009 | B1 | * | 4/2002 | MacManus et al. ......... 165/185 |
| 6,504,718 | B2 | * | 1/2003 | Wu ............................. 361/695 |
| 6,678,157 | B1 | * | 1/2004 | Bestwick .................... 361/695 |
| 6,721,180 | B2 | * | 4/2004 | Le et al. ..................... 361/695 |
| 6,785,145 | B1 | * | 8/2004 | Wong ......................... 361/752 |
| 6,788,540 | B2 | * | 9/2004 | Kruger et al. .............. 361/719 |
| 2002/0186532 | A1 | * | 12/2002 | Tomioka et al. ............ 361/695 |
| 2004/0004812 | A1 | * | 1/2004 | Curlee et al. ............... 361/687 |
| 2004/0085727 | A1 | * | 5/2004 | Kim ............................. 361/687 |

* cited by examiner

*Primary Examiner*—Boris Chérvinsky
(74) *Attorney, Agent, or Firm*—Jung-hua Kuo

(57) ABSTRACT

A drive cooling baffle suitable for rack mount computing systems is disclosed. The drive cooling baffle generally includes a main body defining and extending between inlet and outlet openings, at least one opening is configured to cooperate with a fan to cool an electronics component, the main body portion being configured to generally enclose the electronics component and hook and loop material such as Velcro secured to an interior surface of the main body portion, the hook and loop material being configured and disposed to engage with a corresponding hook and loop material secured to the fan and/or the electronics component. The hook and loop material may be secured to indentations defined in the interior surface of the baffle. The baffle may include a flange to be in contact with an electronics components base to which the baffle, the fan, and the electronics component are attached, the flange being configured to engage with a hold down tab defined in the electronics components base. The baffle may be made of a conductive plastic material and/or may be coated with an electrically conductive coating on its interior surface. The baffle may cooperate with an inflow and an outflow fan where the inflow fan generates greater air movement than the outflow fan.

13 Claims, 3 Drawing Sheets

DRIVE COOLING BAFFLE

BACKGROUND OF THE INVENTION

1. Field of the Invention

The present invention relates generally to rack mount computer systems. More specifically, a drive cooling baffle suitable for rack mount computing systems is disclosed.

2. Description of Related Art

Many of today's more complex computing systems such as computer server systems are often rack-mounted systems in which a number of removable electronics modules, such as electronics trays, are positioned and stacked relative to each other in a shelf-like manner within a frame or rack. Rack-mounted systems allow the arrangement of several of the electronics modules in a vertical orientation for efficient use of space. Each electronics module can be slid into and out of the rack-mounting system. Typically, the electronics modules are inserted from the front of the rack and various cables such as data cables, power cables, etc., are connected to the electronics modules at the front and/or rear of the rack.

Each electronics module may correspond to a different server or each electronics module may hold one or more components of a server. Examples of electronics modules include modules for processing, storage such as random access memory (RAM), network interfaces and controllers, disk drives such as floppy disk drives, hard drives, compact disk (CD) drives, and digital video disk (DVD) drives, parallel and serial ports, small computer systems interface (SCSI) bus controllers, video controllers, power supplies, and so forth. A server farm in today's computing environment may include numerous racks that hold various types of computer-related modules.

When an electronics component on a particular electronics module is to be serviced or replaced, a service technician would typically remove the particular electronics module from the server rack and then remove the electronics component from the electronics module. Drive cooling baffles are sometimes used to help direct the air flow around the electronics components that need to be cooled by fans. Thus, in order to even gain access to the desired electronics component, drive cooling baffles may need to be removed.

The baffles may be mounted to the electronics module via screws engaged with threaded mounting holes provided in the electronics component and/or the electronics module. The service technician must first remove the mounting screws for the baffle before access is gained to the desired electronics component. However, in many electronics modules, the electronics components are mounted side-by-side in close proximity with other electronics components such that access to the mounting screws for the baffle may be blocked. Because access to the baffle mounting screws may be awkward and difficult, removing or reinstalling the mounting screws and baffle is often a difficult task. Further, the removal or reinstallation process would also require the use of tools, making the servicing or replacing of an electronics component a more difficult, labor intensive, and time consuming process. The result is increased server downtime and increased cost resulting from both the server down time and increased labor costs associated with employing the service technician.

Thus, it would be desirable to provide a drive cooling baffle that effectively cooperates with a fan to direct air flow and that provides fast and convenient installation and/or removal onto or out of a computer such as an electronics module of a rack mount computing system.

SUMMARY OF THE INVENTION

A drive cooling baffle suitable for rack mount computing systems is disclosed. It should be appreciated that the present invention can be implemented in numerous ways, including as a process, an apparatus, a system, a device, or a method. Several inventive embodiments of the present invention are described below.

According to one embodiment, the drive cooling baffle generally includes a main body defining and extending between inlet and outlet openings, at least one opening is configured to cooperate with a fan to cool an electronics component, the main body portion being configured to generally enclose the electronics component and hook and loop material such as Velcro secured to an interior surface of the main body portion, the hook and loop material being configured and disposed to engage with a corresponding hook and loop material secured to the fan and/or the electronics component. The hook and loop material may be secured to indentations defined in the interior surface of the baffle. The baffle may include a flange to be in contact with an electronics component base to which the baffle, the fan, and the electronics component are attached, the flange being configured to engage with a hold down tab defined in the electronics components base. The baffle may be made of a conductive plastic material and/or may be coated with an electrically conductive coating on its interior surface. The baffle may cooperate with an inflow and an outflow fan where the inflow fan generates greater air movement than the outflow fan.

According to another embodiment, a drive cooling system generally includes an inflow fan, an outflow fan, and a drive cooling baffle extending generally between the inflow and outflow fans, the baffle being configured to generally enclose at least one electronics component to be cooled.

These and other features and advantages of the present invention will be presented in more detail in the following detailed description and the accompanying figures which illustrate by way of example the principles of the invention.

BRIEF DESCRIPTION OF THE DRAWINGS

The present invention will be readily understood by the following detailed description in conjunction with the accompanying drawings, wherein like reference numerals designate like structural elements.

DESCRIPTION OF SPECIFIC EMBODIMENTS

A drive cooling baffle suitable for rack mount computing systems is disclosed. The following description is presented to enable any person skilled in the art to make and use the invention. Descriptions of specific embodiments and applications are provided only as examples and various modifications will be readily apparent to those skilled in the art. The general principles defined herein may be applied to other embodiments and applications without departing from the spirit and scope of the invention. Thus, the present invention is to be accorded the widest scope encompassing numerous alternatives, modifications and equivalents consistent with the principles and features disclosed herein. For purpose of clarity, details relating to technical material that is known in the technical fields related to the invention have not been described in detail so as not to unnecessarily obscure the present invention.

Figure 1:
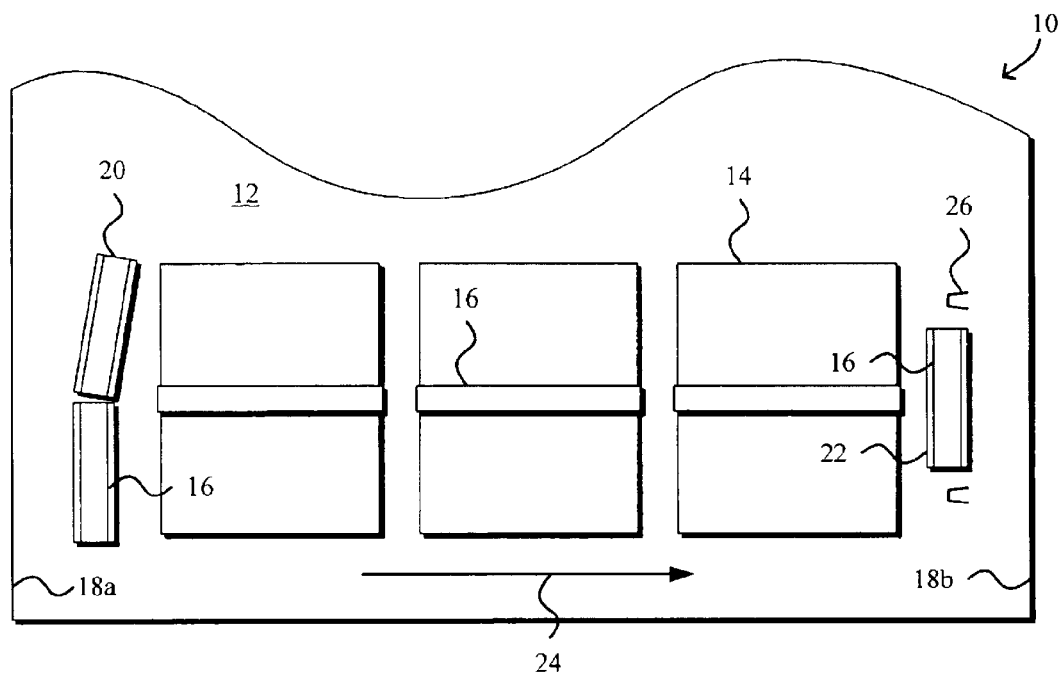
FIG. 1 shows an illustrative configuration of fans and electronics components on an electronics module for a rack mount computing system.

FIG. 1 shows an illustrative configuration of fans 20, 22 to cool electronics components 14 on an electronics module 10 suitable for use and placement in a rack mount computing system (not shown). The electronics components 14 and the fans 20, 22 are attached in a predetermined configuration on an electronics module base or electronics components base 12, such as a tray or shelf. The electronics components 14 may be hard drives or any suitable electronics devices. In one example, the electronics components 14 to be cooled by the fans 20, 22 include three adjacent stacked pairs of electronics devices. Any other number or configuration of the electronics components 14 and/or the fans 20, 22 may also be employed. As is evident, the electronics module 10 typically includes various other electronics components (not shown). Preferably, the electronics components 14 and/or the fans 20, 22 are attached to the electronics components base 12 of the electronics module 10 using a hook and loop material 16 such as Velcro. The base 12 of the electronics module preferably provides hold-down tabs near the electronics components 14 and/or the fans 20, 22 to further facilitate fast and convenient installation and removal of a device cooling baffle as will be described in more detail below.

The fans 20, 22 preferably include inflow fans 20 that draw in ambient cool air from outside of the rack mount system through an inflow side 18a of the electronics module 10 and an outflow fan 22 that pulls warm air away from the electronics components 14 and expels the warm air out of the rack mount system through an opposing outflow side 18b of the electronics module 10. Thus, the direction of the airflow as directed by the fans 20, 22 is generally indicated by arrow 24. Although not shown, the typical rack mount computing system has two open opposing sides through one or both of which the electronics modules 10 stacked within the rack mount system can be installed, accessed, and/or reinstalled by a service technician. The inflow side 18a and the outflow side 18b preferably correspond to the open sides of the rack mount system.

Figure 2:
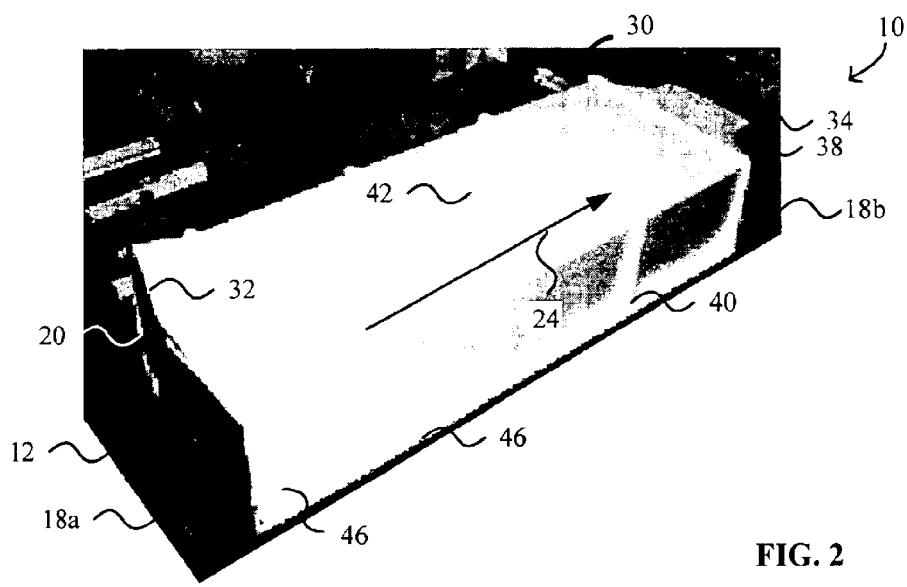
FIG. 2 is a top perspective view of a drive cooling baffle mounted over the fans and electronics components configuration of FIG. 1.
Figure 3:
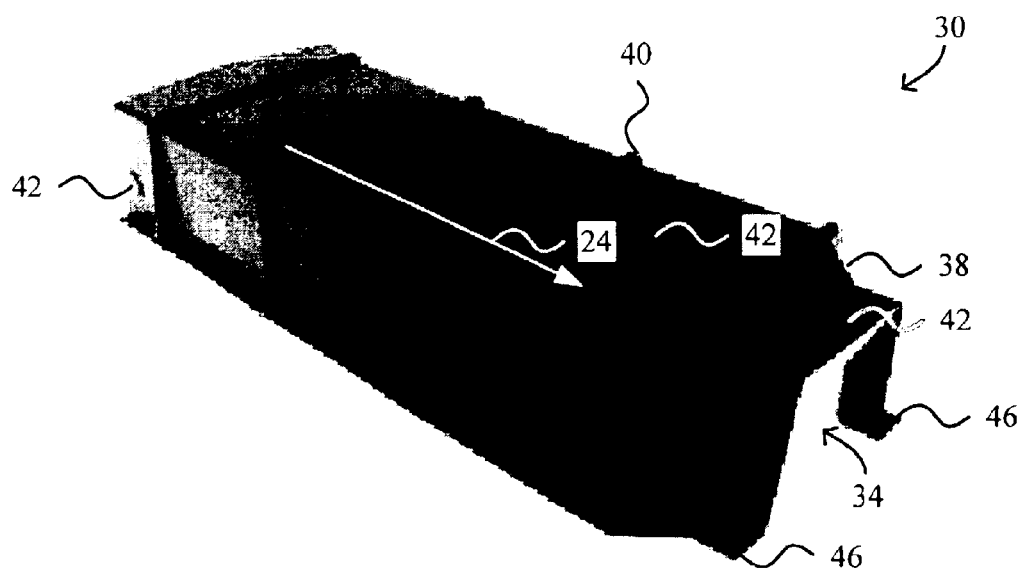
FIG. 3 is a top perspective view illustrating the drive cooling baffle in of FIG. 2 more detail.
Figure 4:
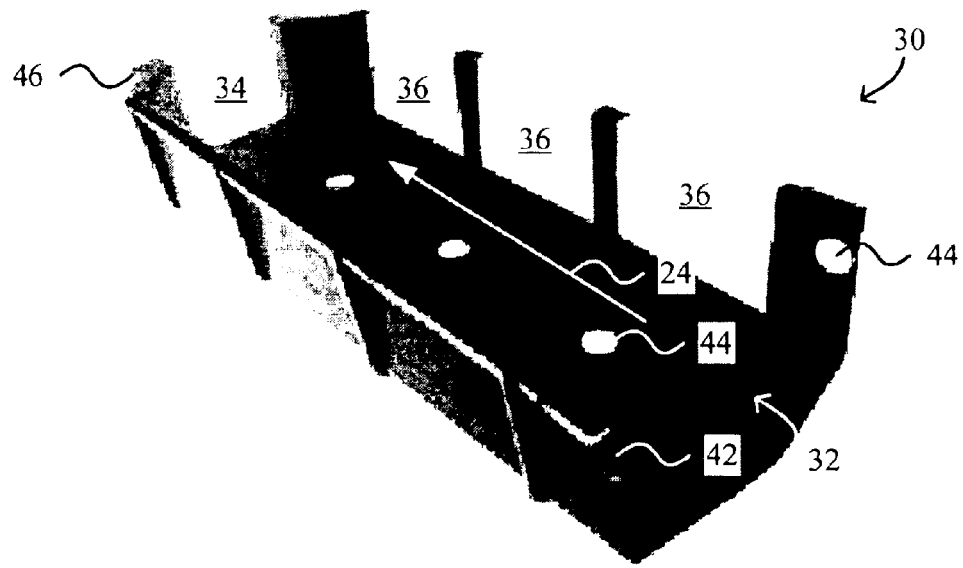
FIG. 4 is an inside perspective view illustrating the drive cooling baffle of FIG. 1 in more detail.

A drive cooling baffle may be provided to better direct airflow in the desire direction 24 so as to ensure better cooling of the electronics components 14. An example of a suitable drive cooling baffle is shown in FIGS. 2–4. In particular, FIG. 2 is a top perspective view of a drive cooling baffle 30 mounted over the fans and electronics components configuration on the electronics components base 12 of FIG. 1. FIGS. 3 and 4 are a top and an inside perspective view, respectively, illustrating the drive cooling baffle 30 in more detail.

The drive cooling baffle 30 is configured to generally enclose the fans and the electronics devices within a volume generally define by the baffle 30, by the electronics components base 12 and by the fans. The drive cooling baffle 30 defines an inflow opening 32 and an outflow opening 34 to allow the fans to direct airflow therebetween. In one example, two fans are provided as the inflow fans 20 while only one fan is provided as the outflow fan 22. Such a configuration may allow the generation of a positive air pressure within the volume enclosed by the drive cooling baffle 30 to further facilitate cooling of the electronics components by ensuring sufficient cool ambient air being drawn into the volume enclosed by the drive cooling baffle 30. The provision of an outflow fan 22 helps to reduce or otherwise overcome the effect of leaks in the volume enclosed by the drive cooling baffle 30. Any suitable number and configuration of inflow and/or outflow fans may be provided. It is noted that a positive air pressure within the volume defined by the baffle may be achieved in other manners. For example, a single inflow fan with greater air movement capabilities (e.g., higher cubic feet per minute (CFM)) may be provided in conjunction with a single outflow fan with a lower air movement capabilities. As seen in FIG. 4, the drive cooling baffle 30 also defines openings 36 for various wiring or other cabling connected to the electronics components to pass therethrough.

In addition, in the example with two inflow fans 20 and a single outflow fan 22, the outflow fan 22 may be positioned in general alignment with the electronics components while the inflow fans 20 may be positioned such that one or both of the inflow fans 20 generally direct airflow away from the openings 36 so as to reduce leakage through the openings 36. Regardless of the specific configurations of the various fans 20, 22, the drive cooling baffle 30 preferably defines tapered ends 38 to accommodate the particular configuration of the fans 20, 22 in order to better direct airflow therethrough. In addition, the main shaft or body portion between the tapered ends 38 of the drive cooling baffle 30 is preferably sized and positioned to as to allow space above and/or around electronics components through which the air may flow. The electronics components themselves are preferably positioned so as to allow space between the electronics component and the electronics components base 12 and/or between stacked electronics components through which the air may flow.

The drive cooling baffle 30 is preferably made of an inexpensive plastic such as polyethylene terephthalate (PET), polyethylene, polypropylene, polyvinylchloride, polycarbonate, acrylic, or any other reasonably stiff thermoforming plastic or any other suitable material. To provide structural integrity or rigidity and to help prevent deformation of the drive cooling baffle 30 particularly when the fans 20, 22 are operating, the drive cooling baffle 30 preferably includes ribs 40. In the example shown, four ribs 40 extend from the side with the openings 36, across the top, and down the other side of the drive cooling baffle 30. Any other number and/or configuration of the ribs 40 and/or any other mechanism to provide structural rigidity to the drive cooling baffle 30 may also be employed.

The drive cooling baffle 30 preferably provides a mechanism to attach and secure and/or to detach the drive cooling baffle 30 to the electronics components base 12, the electronics modules, and/or the fans so as to enable easy, convenient, and fast removal and installation of the drive cooling baffle 30 by the service technician when needed. The attachment and securing mechanism preferably does not require the use of tools. To that end, the drive cooling baffle 30 preferably includes a hook and loop material 44 secured (e.g., adhesive backing, etc.) to an inside surface of the baffle 30 so as to correspond to and engage with the hook and loop material disposed on the electronics components and/or the fans, as described above with reference to FIG. 1. As shown in FIG. 4, various hook and loop material 44, e.g., Velcro tabs, may be attached to the indentations 42 provided in the drive cooling baffle 30 at various locations. For example, the indentations 42 and the hook and loop material 44 may be provided over each stack of electronics components and/or around any of the inflow and outflow fans. As is evident, any suitable number, locations, shapes, sizes, etc. of the indentations 42 and/or the hook and loop material 44 may be provided. As is also evident, the hook and loop material 44 facilitates in securing the drive cooling baffle 30 to the electronics modules and/or the fans which in turn are secured to the electronics components base 12.

Figure 5:
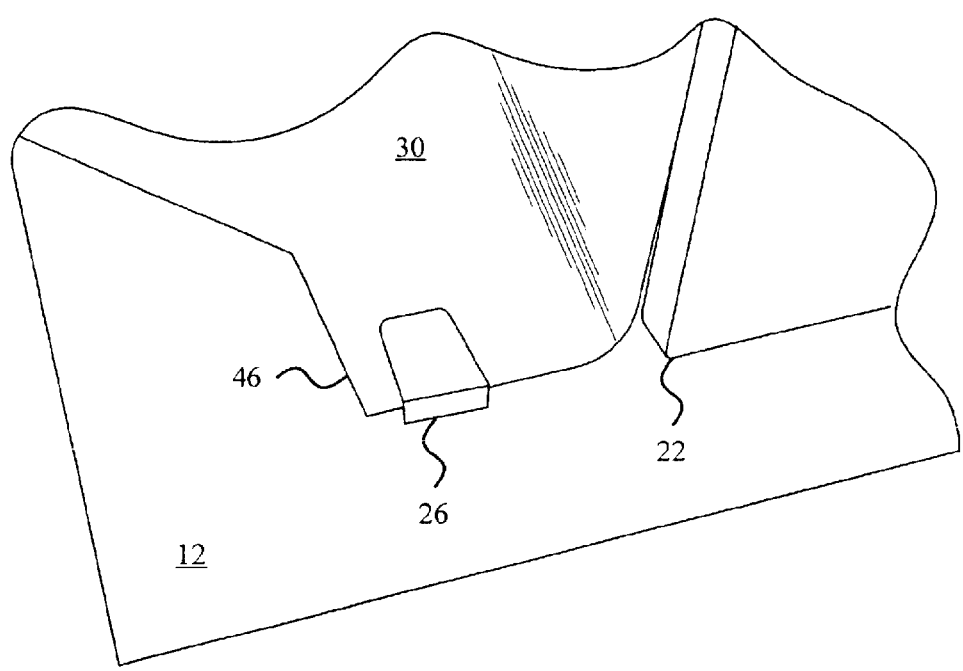
FIG. 5 is a partial perspective view of a flange of the drive cooling baffle held in place by a hold down tab provided on the electronics components base.

The drive cooling baffle 30 may additionally or alternatively be directly secured to the electronics components base 12. For example, FIG. 5 is a partial perspective view of a flange 46 of the drive cooling baffle 30 held in place by the hold down tab 26 provided on the electronics components base 12. The flange 46 of the drive cooling baffle 30 has a surface contact (not merely edge contact) with the electronics components base 12. The hold down tab 26 is preferably configured at a slight angle relative to the electronics components base 12 such that when the flange 46 of the drive cooling baffle 30 is initially inserted into the opening defined by the hold down tab 26, there is little or no force, frictional, compression or otherwise on the flange 46. As the flange 46 is inserted further into the opening defined by the hold down tab 26, a force (e.g., frictional, compression, etc.) is preferably exerted on the flange 46 by the hold down tab 26. As is typical, the electronics components base 12 and thus the hold down tab 26 is generally made of a metal, such as steel. Thus, the hold down tab 26 would generally maintain its shape and configuration while the flange 46 of the drive cooling baffle may be slightly deformed due to the exertion of force from the hold down tab 26. The force thus helps to secure the drive cooling baffle 30 to the electronics components base 12.

Although only two hold down tabs 26 are shown in FIG. 1 adjacent the outflow fan, it is to be understood that any suitable number and configuration of the hold down tabs 26 with cooperating flanges of the drive cooling baffle 30 may be provided. For example, additional or alternative hold down tabs 26 and cooperating flanges may be provided adjacent to the inflow fans and/or electronics components. As the drive cooling baffle 30 is preferably made of a relatively easily deformable plastic or other material, the service technician may easily manually deform the drive cooling baffle 30 so as to tuck and optionally drive the cooperating flanges under the corresponding hold down tabs 26. In addition, the openings 36 defined in the drive cooling baffle 30 also facilitate deformation of the drive cooling baffle 30 by the service technician.

The contact between the flange 46 and the metal electronics components base 12 may also help with grounding of the drive cooling baffle 30, for example, where the drive cooling baffle 30 is made from a conductive plastic material and/or has a conductive coating on an interior surface to make the interior surface of the baffle conductive. Such grounding of the drive cooling baffle 30 may thus help alleviate any build-up of static electricity in the baffle 30. However, depending on the specific application, it is noted that such measures to alleviate any potential build-up of static electricity may not be necessary as a result of sufficient humidity in the ambient air.

While the preferred embodiments of the present invention are described and illustrated herein, it will be appreciated that they are merely illustrative and that modifications can be made to these embodiments without departing from the spirit and scope of the invention. Thus, the invention is intended to be defined only in terms of the following claims.

What is claimed is:

1. A drive cooling baffle, comprising:
 a main body portion defining and extending between an inlet opening and an outlet opening, at least one of the openings is configured to cooperate with a fan to cool at least one electronics component, the main body portion being configured to generally enclose the at least one electronics component; and
 hook and loop material secured to an interior surface of the main body portion, the hook and loop material being configured and disposed to engage with corresponding hook and loop material secured to at least one of the fan and the electronics component.

2. The drive cooling baffle of claim 1, further comprising a flange configured to be in contact with an electronics component base to which the drive cooling baffle, the fan, and the electronics component are attached, the flange being further configured to engage with a hold down tab defined in the electronics components base.

3. The drive cooling baffle of claim 1, wherein the main body portion is made of a conductive plastic material.

4. The drive cooling baffle of claim 1, wherein the interior surface of the main body portion has a conductive coating thereon.

5. The drive cooling baffle of claim 1, wherein the main body portion further defines an opening configured to allow cabling associated with the at least one electronics component to pass therethrough.

6. The drive cooling baffle of claim 1, wherein the main body portion further defines at least one indentation on the interior surface thereof to receive the hook and loop material.

7. A drive cooling system, comprising:
 an inflow fan;
 an outflow fan;
 a drive cooling baffle extending generally between the inflow fan and the outflow fan, the baffle being configured to generally enclose at least one electronics component to be cooled, the drive cooling baffle further includes hook and loop material secured to an interior surface thereof, the hook and loop material being configured and disposed to engage with corresponding hook and loop material secured to at least one of the fans and the electronics component.

8. The drive cooling system of claim 7, wherein the inflow fan is configured to generate greater air movement than the outflow fan.

9. The drive cooling system of claim 7, wherein the drive cooling baffle further defines at least one indentation on the interior surface thereof to receive the hook and loop material.

10. The drive cooling system of claim 7, wherein the baffle further includes a flange configured to be in contact with an electronics components base to which the baffle, the fan, and the electronics component are attached, the flange being further configured to engage with a hold down tab defined in the electronics components base.

11. The drive cooling system of claim 7, wherein the baffle is made of a conductive plastic material.

12. The drive cooling system of claim 7, wherein the interior surface of the baffle has a conductive coating thereon.

13. The drive cooling system of claim 7, wherein the baffle further defines an opening configured to allow cabling associated with the at least one electronics component to pass therethrough.

* * * * *